United States Patent
Hsu et al.

(10) Patent No.: US 11,442,503 B2
(45) Date of Patent: Sep. 13, 2022

(54) WEARABLE BANDS WITH EMBEDDED CIRCUITRY

(71) Applicant: Apple Inc., Cupertino, CA (US)

(72) Inventors: Yung-Yu Hsu, San Jose, CA (US);
Shubham A. Gandhi, Milpitas, CA (US); Mingjing Ha, Cupertino, CA (US); Paul S. Drzaic, Morgan Hill, CA (US); Chang-Chia Huang, Cupertino, CA (US); Han-Chieh Chang, Sunnyvale, CA (US); Bryce T. Bradford, Cupertino, CA (US); David W. Lum, Cupertino, CA (US); Bhaskar Banerjee, San Jose, CA (US); Adam Adjiwibawa, Cupertino, CA (US); David A. Doyle, San Francisco, CA (US); Hong Luo, San Jose, CA (US); Michael J. Brown, Campbell, CA (US)

(73) Assignee: Apple Inc., Cupertino, CA (US)

( * ) Notice: Subject to any disclaimer, the term of this patent is extended or adjusted under 35 U.S.C. 154(b) by 143 days.

(21) Appl. No.: 16/609,176

(22) PCT Filed: May 17, 2018

(86) PCT No.: PCT/US2018/033132
§ 371 (c)(1),
(2) Date: Oct. 28, 2019

(87) PCT Pub. No.: WO2018/213542
PCT Pub. Date: Nov. 22, 2018

(65) Prior Publication Data
US 2020/0192423 A1 Jun. 18, 2020

Related U.S. Application Data

(60) Provisional application No. 62/507,635, filed on May 17, 2017.

(51) Int. Cl.
*G06F 1/16* (2006.01)
*H05K 1/02* (2006.01)

(52) U.S. Cl.
CPC ............ *G06F 1/163* (2013.01); *G06F 1/1652* (2013.01); *H05K 1/028* (2013.01);
(Continued)

(58) Field of Classification Search
None
See application file for complete search history.

(56) References Cited

U.S. PATENT DOCUMENTS 6,493,933 B1 12/2002 Post et al.
8,783,903 B2 7/2014 Bhattacharya et al.
(Continued)

FOREIGN PATENT DOCUMENTS

WO 2017/031153 A1 2/2017

*Primary Examiner* — Xanthia C Cunningham
(74) *Attorney, Agent, or Firm* — Treyz Law Group, P.C.; G. Victor Treyz; David K. Cole

(57) ABSTRACT

An electronic device such as a wearable electronic device may have a band. The band may form a stand-alone device or a strap for a wristwatch unit or other device. Electrical components may be mounted on flexible printed circuit substrates. A substrate may be encapsulated by elastomeric polymer material or other material forming the band. The elastomeric polymer material may form cavities that receive the electrical components. Components such as light-emitting diodes may be mounted to the flexible printed circuit substrates so that the light-emitting diodes are located in the cavities. Reflective sidewalls in the cavities may reflect light from the light-emitting diodes outwardly through a thinned portion of the band. Light-diffusing material in the cavities may be formed from clear polymer with light-scattering particles.

16 Claims, 14 Drawing Sheets

(52) U.S. Cl.
CPC .............. *H05K 2201/0166* (2013.01); *H05K 2201/10106* (2013.01); *H05K 2201/10151* (2013.01)

(56) References Cited

U.S. PATENT DOCUMENTS

| | | | |
|---|---|---|---|
| 9,159,635 | B2 | 10/2015 | Elolampi et al. |
| 9,292,008 | B1* | 3/2016 | Ahamed .............. H04B 1/3888 |
| 9,372,123 | B2 | 6/2016 | Li et al. |
| 10,152,082 | B2* | 12/2018 | Bailey ................... G06F 1/1656 |
| 2010/0325770 | A1 | 12/2010 | Chung et al. |
| 2012/0051005 | A1* | 3/2012 | Vanfleteren ......... H01L 23/3142 |
| | | | 361/749 |
| 2012/0212499 | A1 | 8/2012 | Haddick et al. |
| 2013/0106603 | A1* | 5/2013 | Weast ...................... A61B 5/11 |
| | | | 340/539.11 |
| 2014/0156196 | A1 | 6/2014 | Martinez et al. |
| 2015/0220109 | A1* | 8/2015 | von Badinski ........ A61B 5/349 |
| | | | 340/539.12 |
| 2015/0313542 | A1* | 11/2015 | Goldberg ............. G04G 21/025 |
| | | | 600/384 |
| 2015/0338879 | A1* | 11/2015 | Hiramoto ................ G06F 1/163 |
| | | | 361/679.03 |
| 2015/0340891 | A1* | 11/2015 | Fish ........................ A61B 5/333 |
| | | | 320/103 |
| 2015/0346766 | A1* | 12/2015 | Justice .................... G06F 1/188 |
| | | | 361/679.03 |
| 2016/0170447 | A1* | 6/2016 | Dutta .................... H05K 3/4644 |
| | | | 216/13 |
| 2016/0211471 | A1 | 7/2016 | Kwon et al. |
| 2016/0278203 | A1* | 9/2016 | Nakayama ........... A44C 5/0053 |
| 2016/0327987 | A1* | 11/2016 | Huitema ................ G04G 17/08 |
| 2016/0342176 | A1* | 11/2016 | Han ....................... G04G 21/00 |
| 2016/0357318 | A1 | 12/2016 | Chan et al. |
| 2016/0363957 | A1* | 12/2016 | Stroetmann ........... G06F 1/189 |
| 2017/0038797 | A1* | 2/2017 | Ohsawa ................. G06F 3/0412 |
| 2017/0040306 | A1* | 2/2017 | Kim ....................... H05K 1/181 |
| 2018/0368559 | A1* | 12/2018 | Wang .................... G04G 21/00 |
| 2019/0281717 | A1* | 9/2019 | Aleksov ................. H05K 5/065 |

\* cited by examiner

WEARABLE BANDS WITH EMBEDDED CIRCUITRY

This application claims priority to provisional patent application No. 62/507,635, filed on May 17, 2017, which is hereby incorporated by reference herein in its entirety.

BACKGROUND

This relates generally to electronic devices and, more particularly, to wearable devices.

Electronic devices may include input-output components such as sensors and light-emitting components. It can be challenging to incorporate components such as these into a wearable device. If care is not taken, the wearable device will be overly fragile, bulky, or unattractive.

SUMMARY

An electronic device such as a wearable electronic device may have a band. The band may form a stand-alone device or a strap for a wristwatch or other device. The band may have electrical components. The electrical components may be mounted on flexible printed circuits. A flexible printed circuit may be encapsulated by elastomeric polymer material or other material forming the band. Portions of the flexible printed circuit may have serpentine shapes to enhance flexibility and avoid metal trace cracking.

The elastomeric polymer material may form cavities that receive the electrical components. Electrical components such as light-emitting diodes may be mounted to the flexible printed circuit substrates so that the light-emitting diodes are located in the cavities. Reflective sidewalls in the cavities may reflect light from the light-emitting diodes outwardly through a thinned portion of the band. Light-diffusing material in the cavities may be formed from clear polymer with light-scattering particles.

Electrical components in the band may include buttons, touch sensors, and other input devices, may include sensors such as light sensors, temperature sensors, force sensors, humidity sensors, moisture sensors, particulate sensors, magnetic sensors, accelerometers, pressure sensors, physiological sensors, heart beat sensors, electrocardiogram electrodes for sensing electrocardiograms, ultraviolet light sensors, and other sensors. In some configurations, some electrical components such as sensors may face downwardly towards a user's wrist skin or other portion of a user's body and other electrical components such as light-emitting diodes may face outwardly towards a user's eyes.

DETAILED DESCRIPTION

Figure 1:
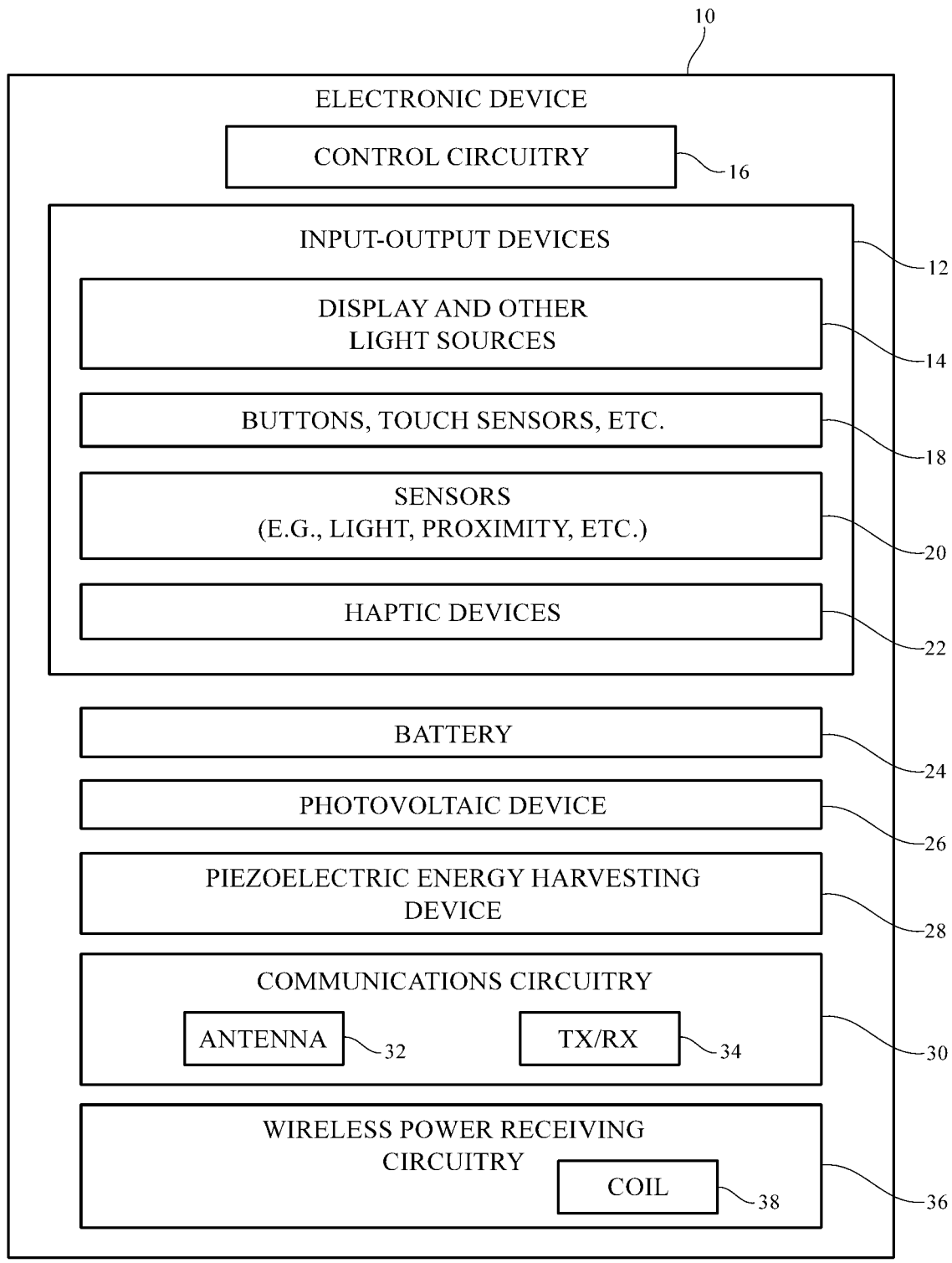
FIG. 1 is a diagram of an illustrative electronic device in accordance with an embodiment.

An illustrative electronic device such as a wearable electronic device is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a wearable band such as a strap for a wristwatch device (detached from or coupled to a main wristwatch unit), a wearable band without any wristwatch unit (e.g., a band of the type sometimes referred to as a health band, fitness band, or activity band), an earring, a key-chain device, a pendant device, a headphone or earpiece device, a device embedded in eyeglasses or other equipment worn on a user's head, or other wearable or miniature device, a display, a computer display that contains an embedded computer, a computer display that does not contain an embedded computer, a gaming device, a navigation device, a remote control, an embedded system such as a system in which electronic equipment with a display is mounted in a kiosk or automobile, or other electronic equipment.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include light-emitting components. For example, input-output devices can include devices such as a display and/or other light sources 14. Light sources 14 may include one or more individual light-emitting devices such as light-emitting diode(s), laser(s), and/or lamp(s). Light sources 12 may also include arrays of pixels for forming displays such as liquid crystal displays, organic light-emitting diode displays, displays formed from crystalline semiconductor dies (microLEDs), etc.

Input-output devices 12 may include input component such as buttons, touch sensors (e.g., capacitive touch sensors, optical touch sensors, etc.), force sensors, and/or other devices for receiving input such as button press input and/or touch or force sensor input.

Sensors 20 may be used in gathering environmental measurements and/or user input and may include ambient light sensors (visible light sensors, color sensitive light sensors, ultraviolet light sensors, etc.), optical proximity sensors, capacitive proximity sensors, temperature sensors, force sensors (e.g., for measuring biometric information), gas pressure sensors, heart rate sensors, blood oxygen level sensors (e.g., based on emitted and detected light), electrocardiogram sensors (e.g., sensors for measuring electrical signals on a user's body), particulate sensors (e.g., sensors that use light measurements and/or other measurements to measure particulate concentration in the air), image sensors (cameras), gas pressure sensors, carbon dioxide sensors and/or sensors measuring other gas concentrations, position and/or orientation sensors (e.g., inertial measurement units based on one or more sensors such as accelerometers, gyroscopes, and/or compasses), accelerometers for gathering user tap input, etc.

Haptic output devices 22 may include piezoelectric devices, electromagnetic actuators, and/or other actuators for generating haptic output.

Device 10 may include one or more batteries such as battery 24. Battery 24 may be recharged via a wired connection or, if desired, device 10 may recharge battery 24 using wirelessly received power. Power may be received wirelessly using wireless power receiving circuitry 36. Wireless power receiving circuitry 36 may include, for example, inductive charging components such as coil 38 and a corresponding rectifier circuit or other wireless power receiving circuit for converting wirelessly received power from coil 38 into direct-current power for powering device 10 and charging battery 24. If desired, ambient light can be converted into direct-current power for device 10 using photovoltaic device 26 (solar cells). Energy can also be harvested from movements of the user of device 10 (e.g., using piezoelectric energy harvesting device 28 or other energy harvesting circuitry).

Control circuitry 16 may use communications circuitry 30 to transmit data to external equipment and to receive data from external equipment. Communications circuitry 30 may include wireless communication circuitry such as one or more antennas such as antenna 32 and associate radio-frequency transceiver circuitry 34. Transceiver circuitry 34 may include wireless local area network transceiver circuitry (e.g., WiFi® circuitry), Bluetooth® circuitry, cellular telephone transceiver circuitry, millimeter wave transceiver circuitry, near-field communications circuitry, and/or wireless circuitry that transmits and/or receives signals using light (e.g., with light-emitting diodes, lasers, or other light sources and corresponding light detectors such as photodetectors).

Figure 2:
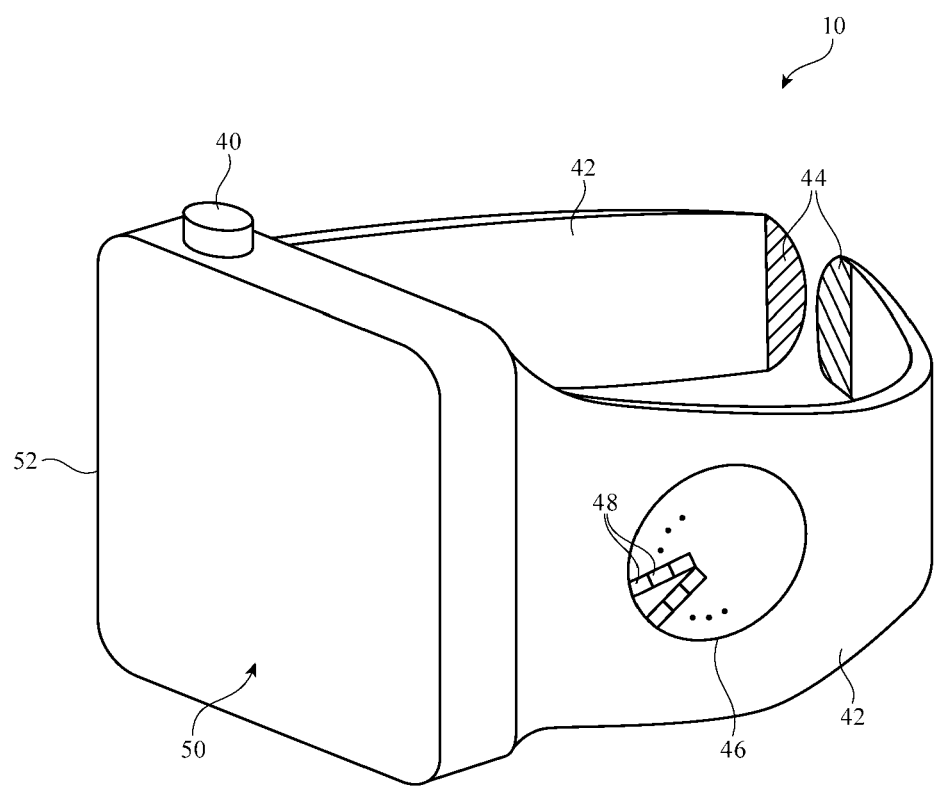
FIG. 2 is a perspective view of an illustrative wearable electronic device such as a wristwatch with a strap in accordance with an embodiment.

FIG. 2 is a perspective view of an illustrative electronic device 10. Device 10 of FIG. 2 is a wristwatch and may include components such as main electrical unit 52 and/or band 42. Band 42 may also be configured to operate as a stand-alone unit. Illustrative configurations for device 10 in which device 10 includes band 42 (e.g., a removable strap for main unit 52, a stand-alone band without an associated main unit 52, a band portion of a complete wristwatch, etc.) may sometimes be described herein as examples. In general, device 10 may include any suitable structures (e.g., different types of wearable housings, etc.) that incorporate circuitry of the type shown in FIG. 1. The circuitry of FIG. 1 may be located entirely in band 42 and/or may be located partially in main unit 52 and partially in band 42.

As shown in FIG. 2, main unit 52 may include a display such as touch screen display 50 and input-output devices such as rotatable button 40. Band (strap) 42 may be coupled to main unit 52 using magnets, pins, a tongue-and-groove configuration, using housing slits or other openings that receive band 42, and/or other configurations in which band 42 is attached to main unit 52.

Band 42 may be a single unitary band (e.g., a loop or a C-shaped band having ends that attach to respective edges of main unit 52) or may be formed from first and second portions that can be joined by clasp 44 (e.g., a magnetic clasp, a mechanical clasp, etc.). Band 42 may be formed from elastomeric polymer (e.g., silicone and/or other stretchable plastics), may be formed from metal (e.g., metal links, interlinked chain links, etc.), may be formed from fabric (e.g., fabric such as knit fabric, woven fabric, and/or braided fabric), may be formed from other materials (e.g., wood or other natural materials, ceramic, crystalline materials, etc.), and/or may be formed from a combination of these materials. Configurations in which band 42 is formed from elastomeric polymer materials may sometimes be described herein as an example. This is, however, merely illustrative. Band 42 may, in general, be formed from any suitable materials.

Portions of band 42 may be provided with input-output devices 12 and/or other components such as the illustrative circuitry of device 10 of FIG. 1. The circuitry of device 10 may, for example, be formed on the outer surface of band 42 and/or on the inner surface of band 42. As an example, light sources 14 (e.g., a pixel array, one or more light-emitting diodes, etc.) may be formed in a region such as region 46 of band 42 of FIG. 2. Region 46 may be circular, oval, rectangular, and/or may have other shapes. Region 46 may be a single contiguous area on band 42 and/or may include multiple discrete areas. Region 46 of FIG. 2 is located on the outer surface of band 42, but regions such as region 46 may, if desired, extend onto the inner surface of band 42 (e.g., the surface of band 42 that faces a user's skin such as a user's wrist skin when device 10 is worn on the wrist of a user). Region 46 may include input devices (e.g., touch sensors, buttons, force sensors, cameras, etc.) and may include output devices (e.g., haptic device 22 and light sources 14). For example, region 46 may include light-emitting devices such as light-emitting diodes 48.

Light-emitting diodes 48 may be arranged in a circular pattern, a rectangular pattern (e.g., a rectangular array having rows and columns), may be arranged in a pattern with a coarse pitch (e.g., a pixel-to-pixel spacing of 0.1-1 mm, greater than 0.5 mm, less than 2 mm, etc.) to serve as a status indicator or a display with a relatively low resolution and/or may be arranged in a pattern with a fine pitch (e.g., a pixel-to-pixel spacing of 0.01 mm, less than 0.01 mm, 0.01-0.1 mm, more than 0.05 mm, etc.) to serve as a display that displays images. Light-emitting diodes 48 may include bare unpackaged crystalline semiconductor dies and/or may include packaged light-emitting diodes. Light-emitting diodes 48 may operate at infrared, ultraviolet, and/or visible light wavelengths. For example, light-emitting diodes 48 may supply visible light such as red, green, and blue light.

During operation, the light-emitting diodes 48 of region 46 may be used to provide a user of device 10 with visual output such as alerts (e.g., timer alerts, incoming message alerts, etc.), emojis, messages, text, graphics, images, moving images, flashing lights or lights of particular colors or patterns of colors that serve as status indicators (e.g., power level indicators, wireless signal strength indicators, hear beats per minute readouts, an ultraviolet light exposure indicator, etc.), and/or other suitable visual output.

Figure 3:
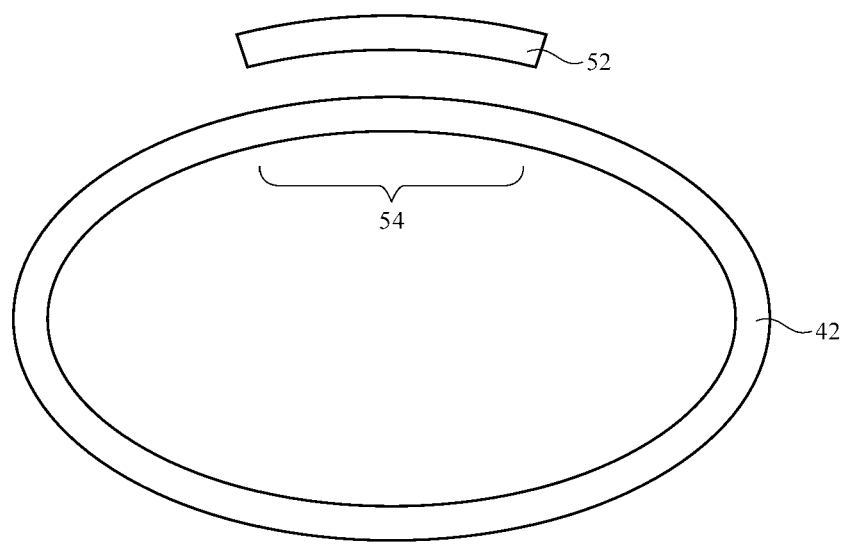
FIG. 3 is a side view of an illustrative wearable electronic device in accordance with an embodiment.

FIG. 3 shows how band 42 may be operated separately from main unit 52 (e.g., to serve as a stand-along fitness band, etc.). If desired, portion 54 of band 42 may be provided with magnets or other components to facilitate removable attachment of main unit 52. Band 42 of FIG. 3 may be claspless (as shown in FIG. 3) or may be provided with a clasp such as clasp 44 of FIG. 2.

Figure 4:
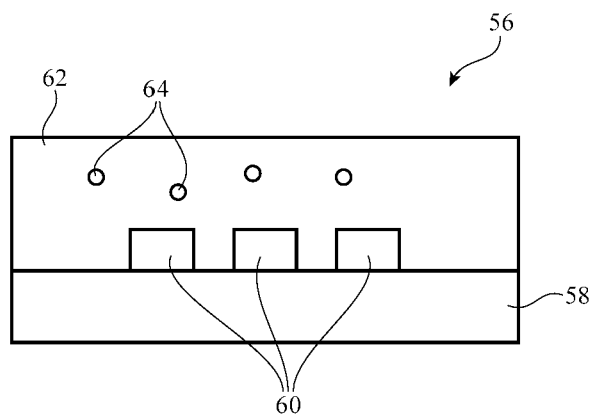
FIG. 4 is a cross-sectional side view of light-emitting diodes in an illustrative package without sidewalls in accordance with an embodiment.

FIG. 4 is a cross-sectional side view of an illustrative packaged light-emitting diode device. Packaged light-emitting diode device 56 may include one or more light-emitting diodes and/or laser diodes on one or more semiconductor dies. As an example, each packaged light-emitting diode device 56 may include one or more light-emitting diodes 60. Diodes 60 may be formed on a common die or separate respective dies. Light-emitting diodes 60 may have the same color or may have different colors. Device 56 may include one light-emitting diode 60, at least two light-emitting diodes 60, at least three light-emitting diodes 60, at least four light-emitting diodes 60, or other suitable number of light-emitting diodes 60.

In the illustrative configuration of FIG. 4, device 56 includes three light-emitting diodes 60. These three light-emitting diodes 60 may include, for example, a red light-emitting diode, a green light-emitting diode, and a blue light-emitting diode. If desired, diodes 60 of other colors may be used (e.g., white light-emitting diodes, yellow light-emitting diodes, etc.).

Packaged light-emitting diode device 56 may include package encapsulant 62. Encapsulant 62 may be formed from an insulating material such as clear polymer. If desired, light-diffusing particles 64 may be incorporated into some or all of encapsulant 62. Light-diffusing particles 64 may be formed from inorganic particles with a high index of refraction (e.g., titanium oxide, aluminum oxide, etc.), and/or other light-scattering structures.

Figure 5:
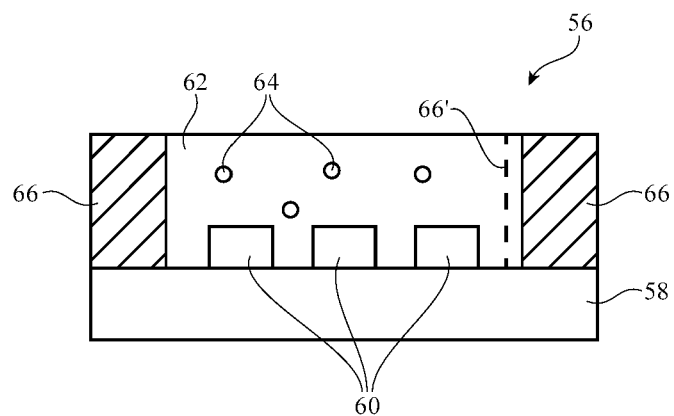
FIG. 5 is a cross-sectional side view of light-emitting diodes in an illustrative package with vertical sidewalls in accordance with an embodiment.

One or more edges of each device 56 may have sidewalls such as illustrative sidewalls 66 of FIG. 5. Sidewalls 66 may be formed from white polymer to help reflect light that has been emitted by light-emitting diodes or may be formed from other suitable material (e.g., opaque material to prevent light leakage between adjacent devices 56, polymers such as black polymers, polymers such as epoxy doped with light scattering particles or other polymers containing light scattering particles such as titanium dioxide particles or other particles with indices of refraction that differ from the indices of refraction of the polymers, etc.).

Figure 6:
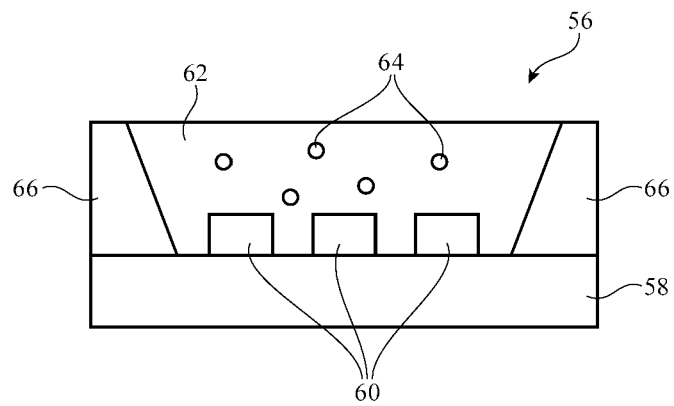
FIG. 6 is a cross-sectional side view of light-emitting diodes in an illustrative package with tapered sidewalls in accordance with an embodiment.

If desired, the inner surfaces of sidewalls 66 may be coated with a reflective coating such as coating 66'. Coating 66' may be a layer of white polymer, a dielectric stack that is configured to form a mirror coating, a metal coating, and/or other reflective coating material. Sidewalls 66 may be formed on all four edges of device 56, may be formed on two of the four edges of device (e.g., a pair of opposing edges), etc. As shown in FIG. 6, sidewalls 66 may be tapered. The slanted shape of tapered sidewalls 66 of FIG. 6 may help direct emitted light upwards in direction Z.

Electrical components such as devices 56 may be mounted on one or more substrates in band 42. For example, devices 56 and other electrical components may be mounted on one or more flexible printed circuits such as flexible printed circuit 78 of FIG. 7. Flexible printed circuit 78 may be formed from metal traces on a sheet of polyimide or other flexible polymer layer.

Figure 7:
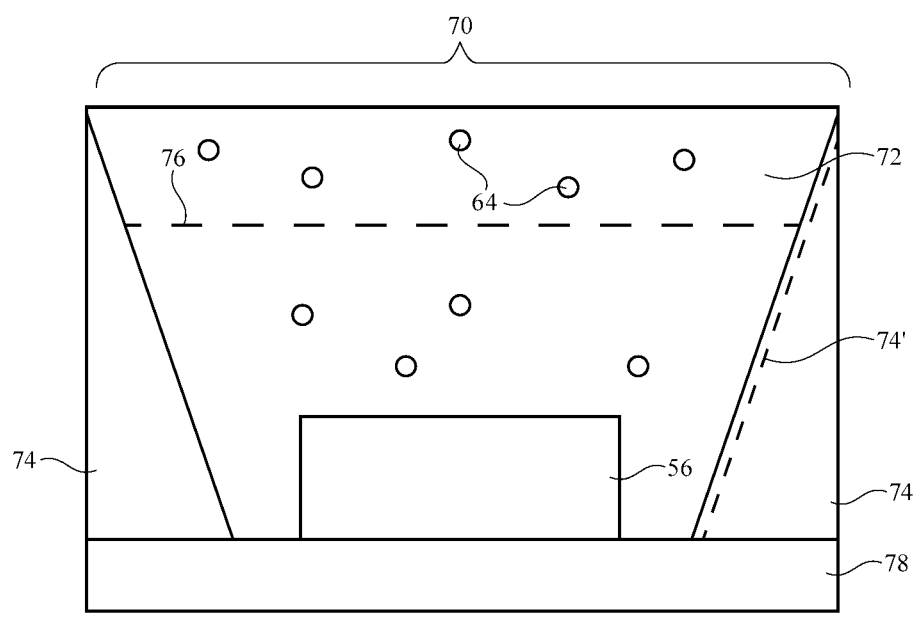
FIG. 7 is a cross-sectional side view of an illustrative light-emitting diode such as a packaged light-emitting diode device in a cavity in a wearable device structure such as a band in accordance with an embodiment.

Flexible printed circuits such as flexible printed circuit 78 may be covered with band material such as polymer 74 or other material. Polymer 74 may be, for example, elastomeric polymer that allows band 42 to stretch. As shown in FIG. 7, polymer 74 may be patterned by injection molding or other techniques to cover flexible printed circuit 78 while forming cavities such as cavity 70. One or more devices 56 and/or other electrical components may be mounted to flexible printed circuit 78 within each cavity 70.

Cavity 70 may have vertical sidewalls and/or tapered sidewalls of the type shown in FIG. 7 that are formed from material 74. Material 74 may be reflective (e.g., material 74 may be formed from white polymer, etc.) and/or the surfaces of material 74 that line cavity 70 may be provided with a reflective coating such as coating 74'. Coating 74' may be formed from white polymer, a dielectric mirror coating formed from a stack of dielectric materials of different indices of refraction, and/or metal.

The interior of cavity 70 may be filled with polymer 72 (e.g., clear polymer). Polymer 72 may include light-scattering particles such as particles 64 (e.g., polymer 72 and particles 64 may form a light diffusing material in cavity 70 that helps to diffuse emitted light from device 56). If desired, a portion of polymer 72 may be free of particles 64 (e.g., the portion of polymer 72 above line 76 may include light-scattering particles 64 and the portion of polymer 72 below line 76 may be clear and free of light-scattering particles). If desired, cavity 70 can be filled with materials that enhance light extraction. The materials may have higher or lower refractive index values than encapsulation 62 and/or may include a stack of materials with gradient refractive indices. The materials may contain particles (e.g., inorganic particles such as metal oxide particles, etc.) with various refractive indices. One or more layers of material may have patterned portions to produce desired optical effects. For example, one or more layers may be formed in the shapes of lenses, may have roughened surfaces to help diffuse emitted light, etc.

Figure 8:
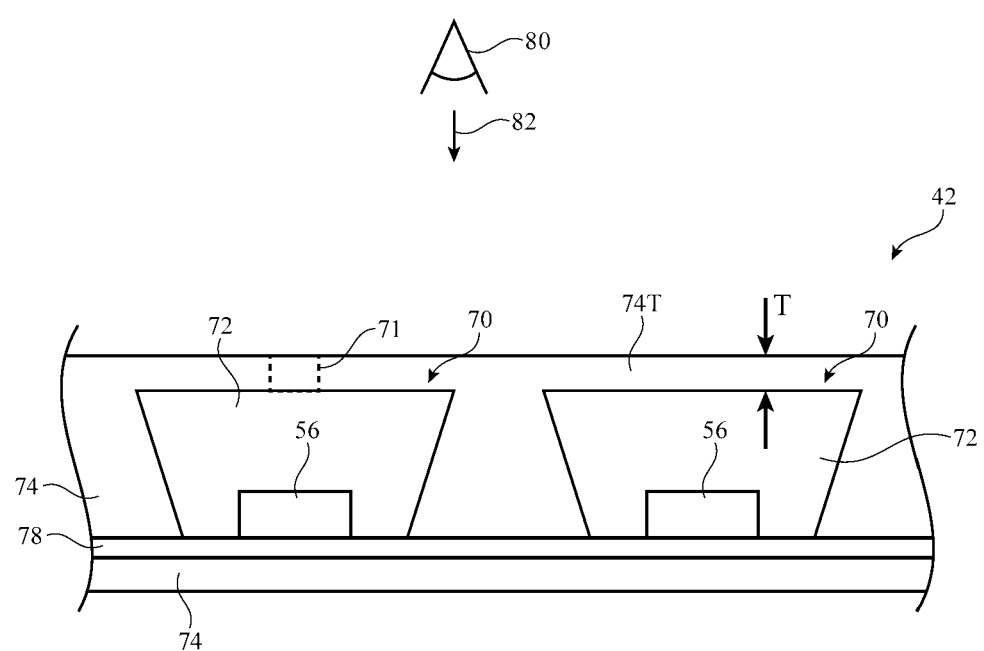
FIG. 8 is a cross-sectional side view of an illustrative band having an array of cavities with respective components such as light-emitting diode devices in accordance with an embodiment.

FIG. 8 is a cross-sectional side view of band 42 in an illustrative configuration in which cavities 70 filled with polymer 72 have been formed in band structures of polymer 74. Polymer 74 may include portions above flexible printed circuit 78 and below flexible printed circuit 78 (e.g., polymer 74 may surround flexible printed circuit 78) to form band 42. Portion 74T of polymer 74 overlaps each cavity 70 and may have a thickness T (e.g., 200-300 microns, at least 50 microns, less than 500 microns, etc.) that is sufficiently thin to allow light from light-emitting components such as packaged light-emitting diode devices 56 to pass through portion 74T. When devices 56 are turned off and are not emitting light, portion 74T may have an opaque appearance that hides internal components such as devices 56 from view. When devices 56 are turned on and are emitting light, the light may be visible to a viewer such as viewer 80 who is viewing band 42 in direction 82. If desired, light-based components such as light-emitting diodes, light detectors, etc. may be located under clear windows in an opaque portion of band 42 (see, e.g., optional window 71).

Figure 9:
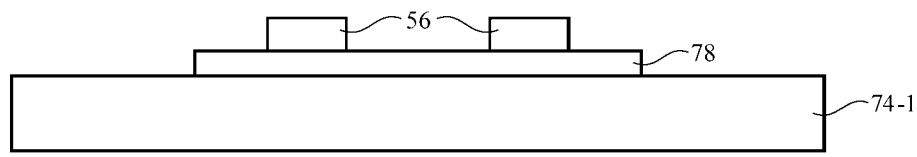
FIGS. 9 and 10 are cross-sectional side views of an illustrative band at different stages of fabrication in accordance with an embodiment.
Figure 10:
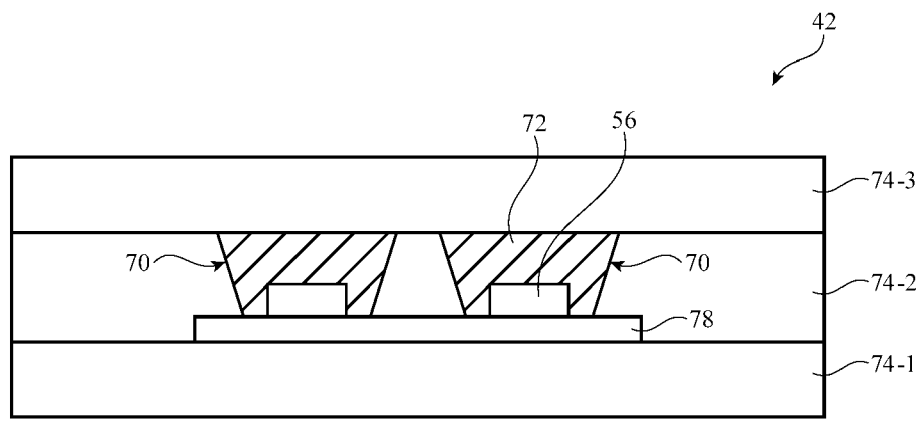

Band 42 may be fabricated using molding operations, laminating operations, and/or band 42 may be formed using other processes for patterning polymer 74 and/or other materials. FIGS. 9 and 10 are cross-sectional side views of band 42 during an illustrative fabrication process. As shown in FIG. 9, polymer portion 74-1 may be formed by molding a first shot of polymer material in a mold. Polymer portion 74-1 may have the shape of a thin sheet. Flexible printed circuit 78 and devices 56 may be attached to polymer portion 74-1 during molding (e.g., by including these structures in the mold cavity) or after molding (e.g., by laminating with adhesive, etc.).

After forming the structures of FIG. 9, a second shot of polymer may be molded over flexible printed circuit 78 to form polymer portion 74-2 of FIG. 10. Cavities 70 may be filled with polymer encapsulant 72 (e.g., with embedded light-scattering particles 64) using an ink-jet printing tool or other polymer patterning equipment. A third shot of polymer (polymer portion 74-3) may be molded over polymer portions 74-2 and 74-1, and flexible printed circuit 78 to form band 42. Polymer portion 74-3 may be opaque with a sufficient thickness to permit light from devices 56 to pass through layer 74-3 (e.g. polymer portions 74-1, 74-2, and 74-3 may be formed from polymer of the same color such as black polymer, white polymer, red polymer, etc.) or, if desired, different shots of plastic used in forming band 42 may have different colors and/or may be translucent, clear, etc. If desired, four or more different shots of plastic or fewer than three shots may be used in forming band 42. Clear windows, perforations, and/or other structures may be formed in polymer 74 to enhance light transmission, to form air passageways, etc.

Figure 11:
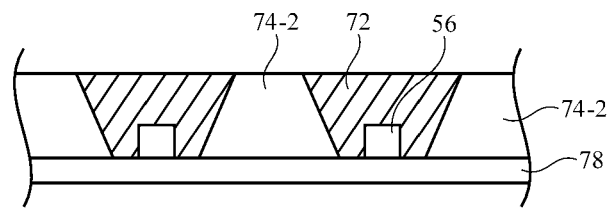
FIG. 11 is a cross-sectional side view of an illustrative partially assembled structure for incorporation into a band in accordance with an embodiment.

FIG. 11 shows how plastic portion 74-2 may be molded over printed circuit 78 to form cavities 70 in alignment with devices 56 and shows how cavities 70 may be filled with polymer 72 (e.g., polymer with embedded light-scattering particles 64 so that polymer 72 forms a light-diffusing layer). This type of structure may subsequently be embedded in one or more additional shots of polymer to form band 42. Configurations in which band 42 is formed using other molding processes, in which band 42 is formed by cutting premolded polymer, and/or in which band 42 is formed using other techniques (lamination, laser processing, etc.) may also be used. The illustrative fabrication operations of FIGS. 9, 10, and 11 are merely illustrative.

Figure 12:
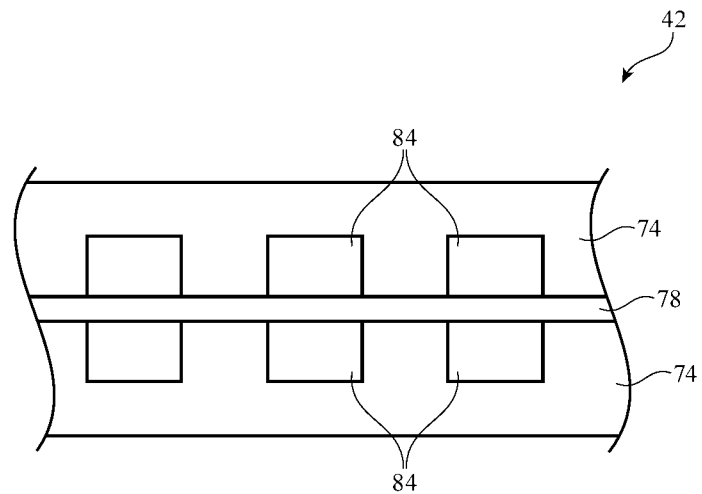
FIG. 12 is a cross-sectional side view of an illustrative band having a flexible printed circuit substrate with components mounted on opposing upper and lower surfaces in accordance with an embodiment.
Figure 13:
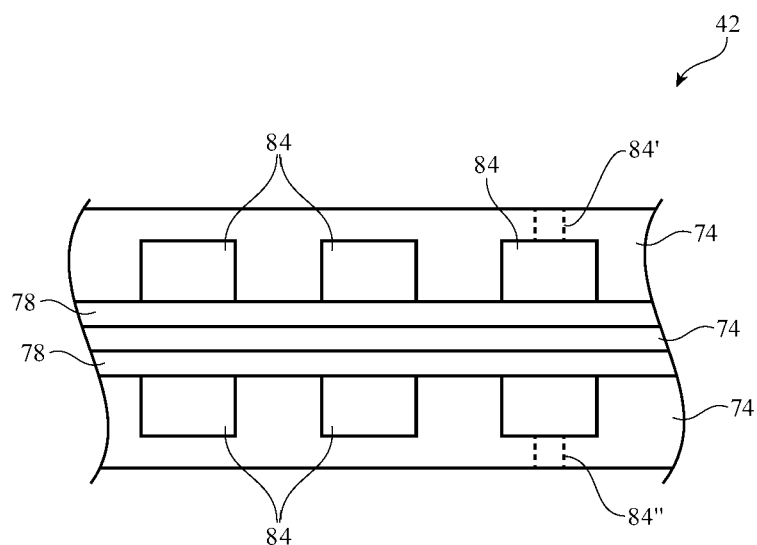
FIG. 13 is a cross-sectional side view of an illustrative band having first and second flexible printed circuits having respective first and second sets of components mounted to face away from each other outwardly through the band in accordance with an embodiment.

FIG. 12 shows how electrical components 84 may be mounted on opposing upper and lower sides of flexible printed circuit 78. Polymer 74 may be molded around components 84 to form band 42. If desired, polymer 74 may be patterned to form cavities 70 filled with polymer 72 (see, e.g., FIG. 8). In the example of FIG. 13, band 42 contains two flexible printed circuits 78. An upper of the two flexible printed circuits 78 has an upper set of electrical components 84 that face upwards. A lower of the two flexible printed circuits 78 has a lower set of electrical components 84 that face downwards, away from the upper flexible printed circuit and away from the components mounted on the upper flexible printed circuit. If desired, cavities 70 filled with polymer 72 may be formed in polymer 74 of FIG. 13 in alignment with components 84, as described in connection with FIG. 8.

Electrical components 84 may include light-emitting diode devices 56 and/or other electrical components (e.g., components that form some or all of devices such as display and other light sources 14), buttons, touch sensors, and other input devices 18, sensors 20 (e.g., light sensors, touch sensors, force sensors, accelerometers for gathering user tap input and/or orientation and motion information, and/or other sensors in device 10), haptic devices 22, battery 24, photovoltaic device 26, piezoelectric energy harvesting device 28, communications circuitry 30, wireless power receiving circuitry 36, and/or control circuitry 16. Electrical components 84 such as these may face outwardly on both the upper and lower surfaces of band 42 (see, e.g., FIGS. 12 and 13) or may face upwardly (see, e.g., illustrative electrical components 84 such as devices 56 of FIG. 8).

As the examples of FIGS. 8, 12, and 13 demonstrate, one or more flexible printed circuits 78 may be populated with electrical components 84 and these electrical components may face upwards and/or downwards relative to band 42 and the user's skin (e.g., the user's wrist, which may lie under the lower surface of band 42). Using configurations such as these, electrical components 84 of band 42 may gather information on a user's health, may gather information on the environment, and/or may gather user input (e.g., taps or other touch gestures, etc.).

Consider, as an example, the measurement of a user's blood oxygen level. Using components 84 that emit light (e.g., packaged light-emitting diodes 56), light may be emitted towards a user's finger in contact with the upper surface of band 42. This light may pass through a user's blood, which may absorb the light in proportion to the amount of oxygen being carried by the user's blood. Using a photodetector in diodes 56, the light may be measured and the amount of absorbed light determined to produce a blood oxygen reading (e.g., components 84 may form a pulse oximetry device for band 42).

As another example, components 84 on the upper surface of band 42 may be light-emitting components to provide a user with visual output. Components 84 on the lower surface of band 42 may include pressure sensors (force sensors, strain gauges, etc.) that sense arterial pressure (e.g., the pressure of a user's arteries in the skin of a user's wrist that is in contact with the lower surface of band 42).

If desired, components 84 may form physiological sensors for measuring a user's perspiration level, temperature, or other physiological parameters. For example, the components 84 facing downwards from band 42 may include moisture sensors and/or electrical conductivity measurement electrodes. These components may be configured to measure moisture levels (e.g., a user's perspiration level) and thereby determine whether a user is properly hydrated, etc. Temperature measurements on a user's skin (e.g., a user's body temperature) may be performed with temperature sensors in the components 84 facing the user's skin and/or temperature measurements may be made using outwardly facing temperature sensors (e.g., ambient temperature measurements).

A user's heart rate may be measured by pressure sensors, using optical detection techniques, and/or using other measurements. As an example, one of components 84 (e.g., an infrared light-emitting diode) may emit infrared light downwards through the lower surface of band 42 and an adjacent component 84 (e.g., a photodetector) may measure corresponding reflected light. By analyzing the detected reflected light signals, the user's heartbeat can be determined.

Electrocardiograms may be measured by directing a user to place a fingertip of one hand onto a first electrode (e.g., an electrode formed from one of components 84 that passes through the upper surface of band 42 as illustrated by component 84' of FIG. 13 to expose the electrode) while band 42 is being worn on the user's other hand. A second electrode (see, e.g., component 84", which passes through the lower surface of band 42 of FIG. 13) may be in contact with the user's wrist skin. Control circuitry 16 can be configured to measure the user's electrocardiogram using signals from the first and second electrodes.

In another illustrative configuration, one of components 84 (e.g., an upwardly facing component) may be an ultraviolet light sensor. Control circuitry 16 may gather ultraviolet light measurements as a function of time using the ultraviolet light sensor. The amount of cumulative ultraviolet light exposure for the user may be indicated visually using an ultraviolet light exposure indicator formed from light-emitting diodes 48 of FIG. 1 (e.g., pixels formed by packaged devices 56, pixels in a display, etc.). Components 84 may include gas sensors to measure gas concentrations, humidity sensors to measure air humidity levels, particulate sensors to measure particulate concentrations in the air, and/or other sensors to monitor the ambient environment.

In some configurations, components 84 may be configured to gather user input (e.g., taps, swipes, and/or other gesture input). For example, components 84 may include dome switches and/or other switches that respond to applied pressure from a user's fingertips. As another example, components 84 may include light sources and light detectors that can be used to measure proximity (e.g., whether a user's fingers or other body parts are adjacent to band 42). User finger force input can be gathered using strain gauges, piezoelectric force sensors, and/or other force sensors. If desired, an accelerometer in components 84 may monitor for user finger taps on band 42. If accelerometer measurements indicate that the user's fingers have tapped against band 42 with a desired pattern (e.g., a double tap, single tap, triple tap, etc.), a user's input can be confirmed (e.g., to make a menu selection, to answer a phone call, to adjust media playback settings, to turn on or off a component of band 42, to power band 42 on or off, and/or to adjust the operation of other portions of an electronic device such as device 10, etc.). When a user finger press or other touch or force input is detected, control circuitry 16 can direct a haptic output component in components 84 to supply a user's finger with a corresponding haptic output pulse (e.g., haptic output that serves as feedback indicating that a touch sensor input or other input has been detected by band 42).

Figure 14:
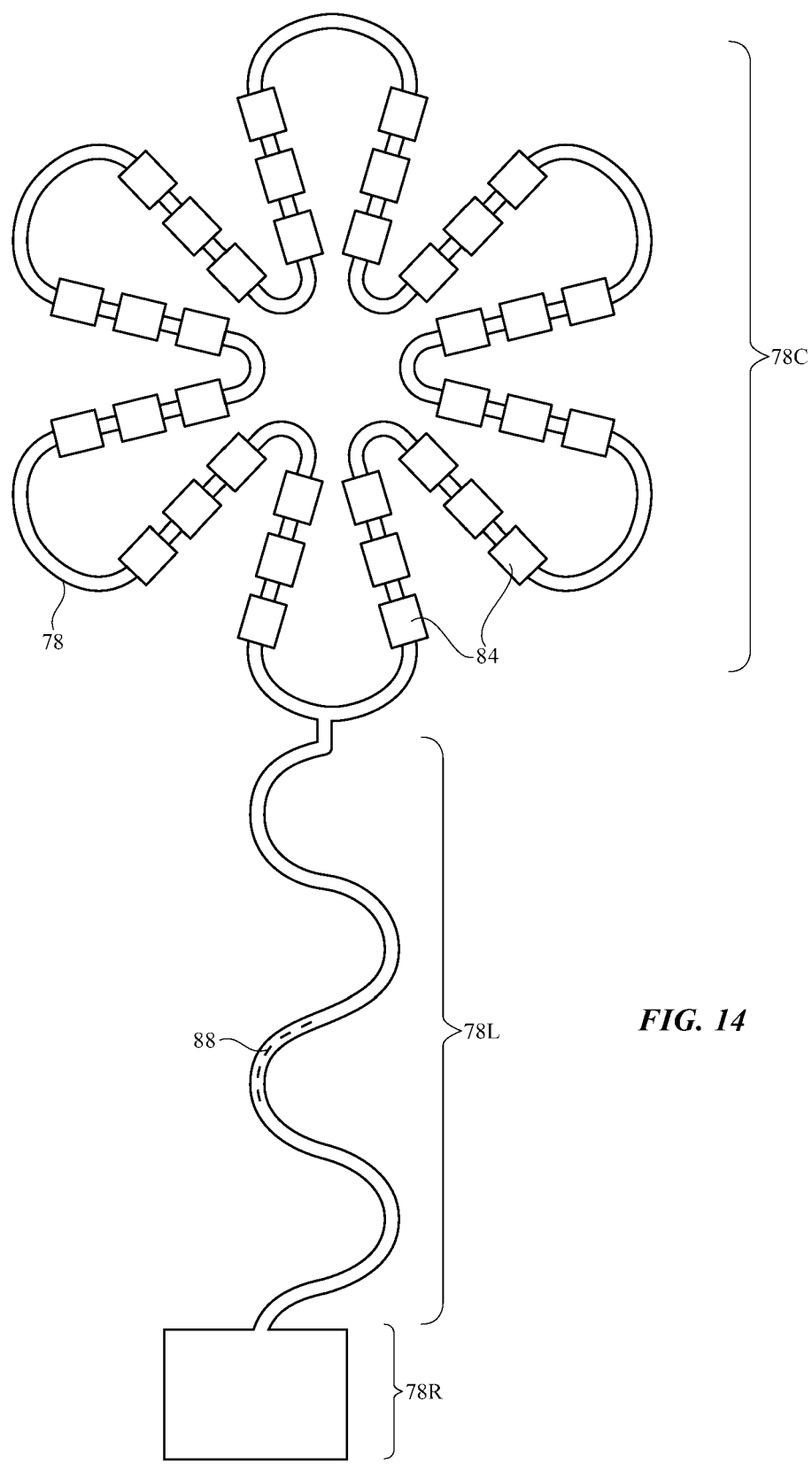
FIG. 14 is a top view of an illustrative flexible printed circuit with a meandering shape and meandering signal traces in accordance with an embodiment.

To enhance flexibility for band 42 and avoid circuit damage and possible delamination of components 84 from printed circuit 78, it may be desirable to provide portions of printed circuit 78 with serpentine shapes. As an example, printed circuit 78 may have portions with serpentine footprints, as shown in FIG. 14. In the arrangement of FIG. 14, portion 78R of printed circuit 78 has a rectangular shape and may have contacts for coupling signal lines in printed circuit 78 to a connector in main unit 52 of device 10. Portion 78L of printed circuit 78 may have a meandering path shape.

Printed circuit 78 may include one or more layers of patterned metal traces such as metal trace 88 (e.g. copper traces, etc.) that form signal lines in printed circuit 78. The use of meandering shapes (e.g., serpentine shapes) for printed circuit 78 and metal traces 88 may help minimize stress and thereby help prevent stress-induced cracks from forming in printed circuit 78. Portion 78C of printed circuit 78 of FIG. 14 has a circular shape formed from radially extending serpentine path segments. Components 84 (e.g., packaged light-emitting diodes 56) may be arranged in a radially symmetric pattern forming concentric circles of components 84 (e.g., to form a circular status indicator with light-emitting diodes such as light-emitting diodes 48 of circular region 46 in FIG. 1). Other shapes and layouts may be used for printed circuit 78 and the components on printed circuit 78, if desired.

Figure 15:
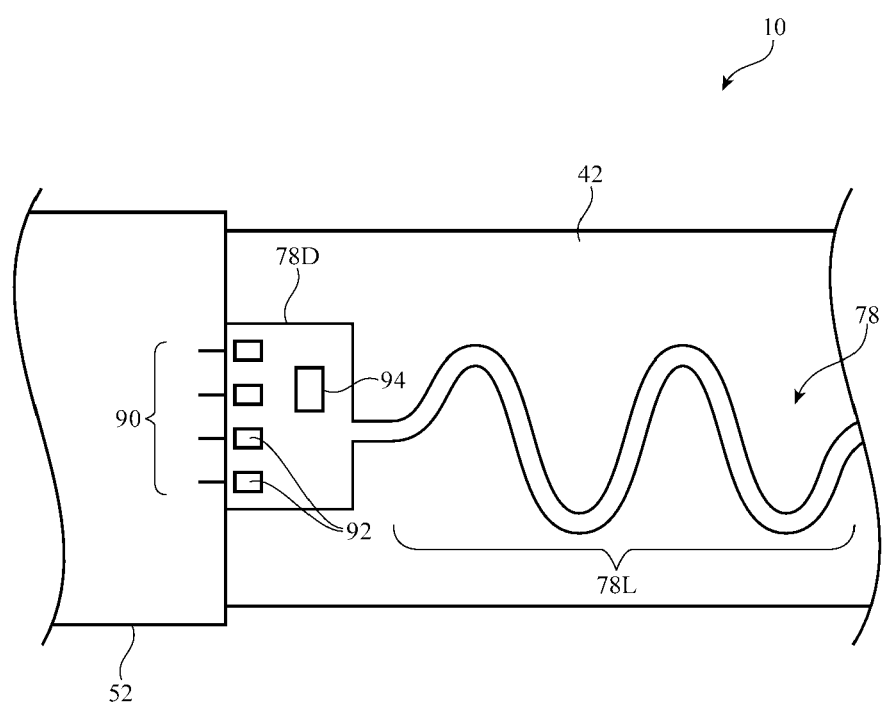
FIG. 15 is a diagram showing how the flexible printed circuit of FIG. 14 may be provided with connector contacts that allow the flexible printed circuit to couple to mating contacts in a connector on a watch unit or other electrical device structure in accordance with an embodiment.

FIG. 15 shows how portion 78D of flexible printed circuit 78 in band 42 may have contacts 92 that mate with corresponding contacts 90 in main unit 52 of device 10. This allows unit 52 and band 42 to exchange power signals and/or data signals. For example, control circuitry in unit 52 may be used to send control signals to a controller integrated circuit or other integrated circuit(s) on portion 78D such as circuit 94 (e.g., control circuitry 16) that circuit 94 uses to control components 84 (e.g., packaged light-emitting diodes 56). If desired, control circuitry in unit 52 may directly send control signals to components 84. The signal paths in printed circuit 78 may also be used in routing sensor measurements, user input, and other signals from printed circuit 78 to main unit 52 and/or to processing circuitry in circuits such as circuit 94.

Figure 16:
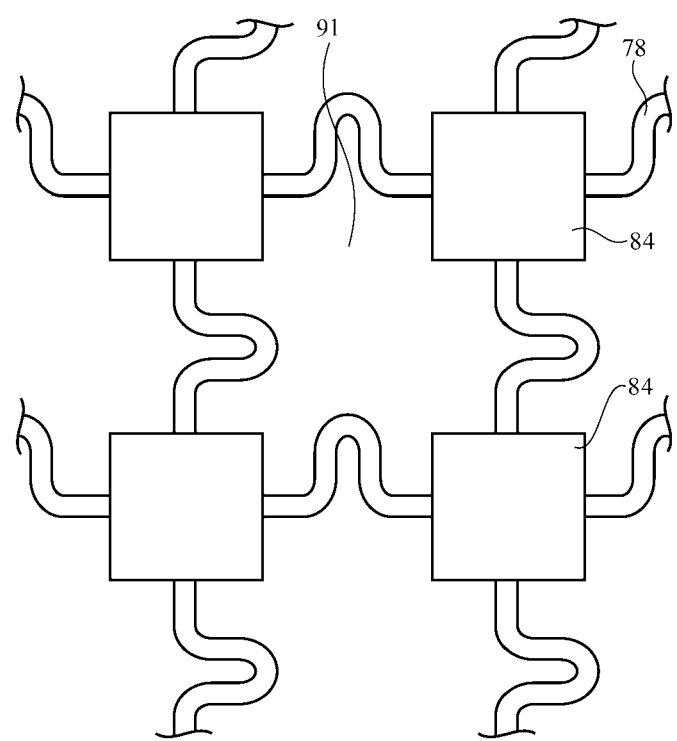
FIG. 16 is a top view of an illustrative flexible printed circuit with a grid-shaped flexible printed circuit having rows and columns of components in an array that are interconnected by meandering segments of the flexible printed circuit in accordance with an embodiment.

If desired, components 84 may be mounted on a flexible printed circuit with serpentine portions in rectangular arrays and/or other patterns other than the illustrative patterns of FIG. 14. As shown in FIG. 16, for example, components 84 may be arranged in an array having rows and columns of components 84 interconnected by serpentine segments of printed circuit 78. Printed circuit 78 may, for example, have a grid shape with an array of openings 91.

Figure 17:
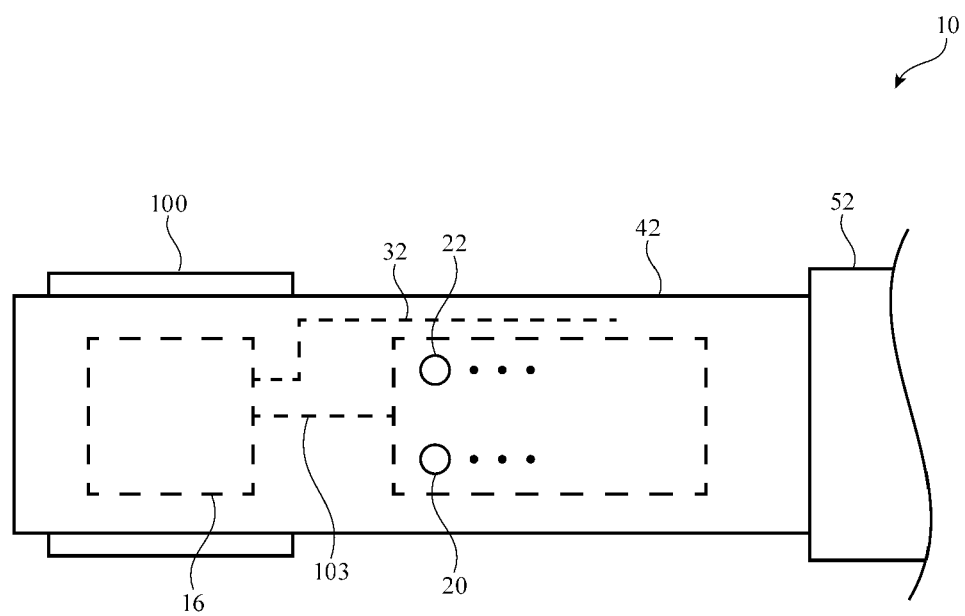
FIG. 17 is a top view of an illustrative band and main unit in an electronic device showing how a buckle may be coupled to a band in accordance with an embodiment.

As shown in FIG. 17, device 10 may have a watchband buckle (clasp) such as buckle 100. Control circuitry 16 may include a system-on-chip device. Additional circuitry may also be located in block 16 of FIG. 17 (e.g., a microphone, a power management integrated circuit, battery 24, etc.). Antenna 32 and other components (e.g., sensors 20, haptic devices 22, etc.) may be formed on a flexible printed circuit in band 42 or may be formed from other structures in band 42. Communications paths 103 may handle I$^2$C communications, Serial Peripheral Interface (SPI) communications, other data, and/or power signals.

Figure 18:
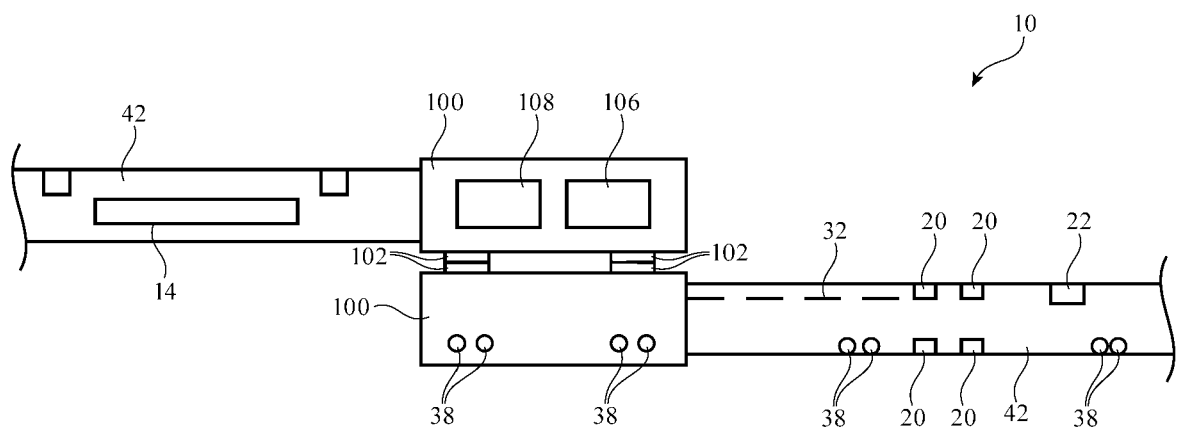
FIG. 18 is a cross-sectional side view of a portion of a device showing how a buckle in the device may have upper and lower mating portions in accordance with an embodiment.

FIG. 18 is a cross-sectional side view of device 10 showing how buckle 100 may have upper and lower (top and bottom) portions coupled with clips 102. Clips 102 may be attached to each other using magnets and/or mechanical engagement structures. Clips 102 may also include interconnects (e.g., metal contacts) for carrying power and/or data. If desired, optical communications circuitry may be include in clips 102 or other portion of buckle 100 (e.g., a light-emitting diode or laser source and a corresponding photodetector such as a photodiode in each half of buckle 100). Wireless charging coils 38 may be formed in one or both buckle portions and/or in one or both of portions of band 42. Display 14 may be formed from pixels on a flexible substrate encased in diffusive band material. Band 42 may be formed from fabric, laminated layers, leather, polymer, opaque materials such as polymer, translucent materials such as polymer, and/or other materials. Sensors 20 in band 42 may include pulse-oximeters, heart rate sensors, and other biological sensors, light sensors such as ultraviolet light sensors, ambient light sensors, and other sensors 20. Haptic elements 22 may be placed in band 42 adjacent to sensors 20 or elsewhere in band 42. Buckle 100 may be formed from a dielectric (e.g., a ceramic or glass or polymer material that is radio-frequency transparent (e.g., in configurations in which antenna 32 is in buckle 100) and/or may be a dielectric material or other material that is compatible with reception of wireless charging signals for coil 38. The top portion of buckle 100 may include display drive circuit 108 and speaker 106. Audio output from speaker 106 may, if desired, be used in creating haptic output for a user's skin.

Figure 19:
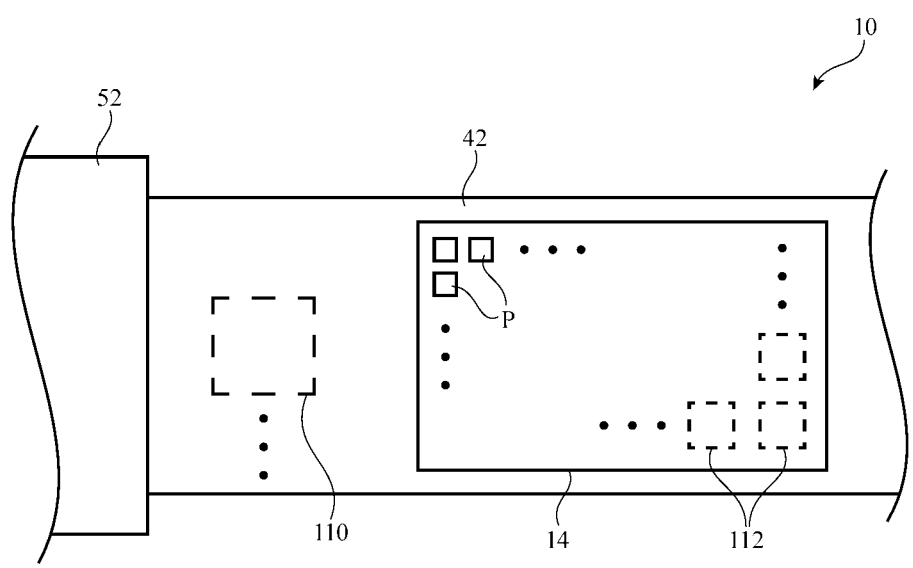
FIG. 19 is a top view of a portion of a band with a display and an electrocardiogram electrode in accordance with an embodiment.

FIG. 19 shows how display 14 may include an array of pixels P. Pixels P may be covered with an array of indium tin oxide pads or other capacitive sensor electrodes 112 (e.g., display 14 may include an overlapping touch sensor so that display 14 functions as a touch screen display). Passive or active matrix configurations may be used for pixels P. Data and gate lines may extend between band 42 and buckle 100 (e.g., in configurations of the type shown in FIG. 19 in which display drive circuitry 108 is in buckle 100). Electrodes 110 may be used for gathering biometric information such as electrocardiogram signals. Main unit 52 can be a digital watch unit that includes a touch screen and other components and/or may be a mechanical watch, a digital watch that does not include a touch screen, and/or a hybrid watch having electrical and mechanical components. In arrangements in which a mechanical watch unit is being coupled between left and right halves of band 42, a flexible printed circuit (see, e.g., circuit 78), wires, optional band material 42, and/or other electrical and/or mechanical structures may extend under the mechanical watch unit (e.g., band 42 may have a recess or other portion that is configured to receive the mechanical watch on top of band 42). This allows components in band 42 that are on the left and right sides of the mechanical watch to communicate with each other.

In some arrangements, processing and power related components may be housed in a rigid portion of device 10 (e.g., in buckle 100). Flexible and stretchable components such as display 14 and sensors 20 may be formed in band 42 (e.g., encapsulated in band material). Band 42 can be used as a stand-alone wristband device (e.g., without using main unit 52) and/or may be detachably coupled to main unit 52 or another watch component (e.g., a mechanical watch). Main unit 52 may contain a main display 14 and band 42 may, if desired contain a secondary display 14 or device 10 may only have a single display in unit 52 or band 42. If desired, band 42, buckle 100, and/or main unit 52 may include solar cells to help charge battery 24.

In accordance with an embodiment, a wearable electronic device is provided that includes a band having portions forming cavities, a flexible printed circuit having serpentine portions, and electrical components on the flexible printed circuit that are located in the cavities.

In accordance with another embodiment, the wearable electronic device includes encapsulant in the cavities that covers the electrical components.

In accordance with another embodiment, the encapsulant includes clear polymer with light-scattering particles.

In accordance with another embodiment, the band includes elastomeric polymer.

In accordance with another embodiment, the electrical components include light-emitting diodes.

In accordance with another embodiment, the cavities have reflective walls.

In accordance with another embodiment, the electrical components include a light-emitting device and a light detector.

In accordance with another embodiment, the electrical components include electrocardiogram electrodes and the wearable electronic device further includes control circuitry configured to measure an electrocardiogram using signals from the electrocardiogram electrodes.

In accordance with another embodiment, the electrical components include components configured to measure moisture.

In accordance with another embodiment, the electrical components include a component selected from the group consisting of: a gas sensor, a humidity sensor, an air particulate sensor, a temperature sensor, a photovoltaic device, a piezoelectric energy harvesting device, a wireless power receiving circuit, a wireless communications circuit, and a haptic output device.

In accordance with another embodiment, the electrical components include an ultraviolet light sensor.

In accordance with another embodiment, the electrical components include light-emitting diodes and the wearable electronic device includes control circuitry configured to control the light-emitting diodes based on information from the ultraviolet light sensor.

In accordance with another embodiment, the band has a portion configured to pass light emitted from the electrical components.

In accordance with another embodiment, the portion is visibly opaque when the electrical components are not emitting light.

In accordance with an embodiment, a watch band is provided that includes an elastomeric band, a flexible printed circuit having serpentine portions embedded in the elastomeric band, and light-emitting diodes on the flexible printed circuit that are configured to emit light through at least some of the elastomeric band material.

In accordance with another embodiment, the flexible printed circuit has contacts configured to mate with contacts on a main unit of a watch.

In accordance with another embodiment, the watch band includes sensors mounted on the flexible printed circuit.

In accordance with another embodiment, the elastomeric band has opposing first and second surfaces, the light-emitting diodes emit light through the first surface, and the sensors gather sensor readings through the second surface.

In accordance with another embodiment, an electronic device is provided that includes a strap having opposing first and second surfaces, an electrical unit coupled to the strap, light-emitting diodes that emit light through the first surface, the strap includes elastomeric polymer and the light-emitting diodes are formed in cavities in the elastomeric polymer that have reflective sidewalls, and sensors that make sensor measurements through the second surface and a flexible printed circuit substrate coupled to the light-emitting diodes.

In accordance with another embodiment, the flexible printed circuit substrate includes at least one serpentine segment, the electronic device includes clear polymer with light-diffusing particles in the cavities.

The foregoing is merely illustrative and various modifications can be made to the described embodiments. The foregoing embodiments may be implemented individually or in any combination.

What is claimed is:

1. A wearable electronic device, comprising:
   a band having portions forming cavities;
   a flexible printed circuit having serpentine portions; and
   electrical components on the flexible printed circuit that are located in the cavities, wherein the electrical components comprise pixels that form a display, wherein the band has a portion configured to pass light emitted from the electrical components, and wherein the portion is visibly opaque when the electrical components are not emitting light.

2. The wearable electronic device defined in claim 1 further comprising encapsulant in the cavities that covers the electrical components.

3. The wearable electronic device defined in claim 2 wherein the encapsulant comprises clear polymer with light-scattering particles.

4. The wearable electronic device defined in claim 1 wherein the band comprises elastomeric polymer.

5. The wearable electronic device defined in claim 1 wherein the electrical components further comprise light-emitting diodes.

6. The wearable electronic device defined in claim 5 wherein the cavities have reflective walls.

7. The wearable electronic device defined in claim 1 wherein the electrical components further comprise a light-emitting device and a light detector.

8. The wearable electronic device defined in claim 1 wherein the electrical components further comprise electrocardiogram electrodes and wherein the wearable electronic device further comprises control circuitry configured to measure an electrocardiogram using signals from the electrocardiogram electrodes.

9. The wearable electronic device defined in claim 1 wherein the electrical components further comprise components configured to measure moisture.

10. The wearable electronic device defined in claim 1 wherein the electrical components further comprise a component selected from the group consisting of: a gas sensor, a humidity sensor, an air particulate sensor, a temperature sensor, a photovoltaic device, a piezoelectric energy harvesting device, a wireless power receiving circuit, a wireless communications circuit, and a haptic output device.

11. The wearable electronic device defined in claim 1 wherein the electrical components further comprise an ultraviolet light sensor.

12. The wearable electronic device defined in claim 11 wherein the electrical components further include light-emitting diodes and wherein the wearable electronic device comprises control circuitry configured to control the light-emitting diodes based on information from the ultraviolet light sensor.

13. A watch band configured to be coupled to a main unit of a watch, the watch band comprising:
    an elastomeric band, wherein the elastomeric band has a first portion and a second portion;
    a flexible printed circuit having serpentine portions embedded in the elastomeric band, wherein the flexible printed circuit has first electrical contacts configured to mate with second electrical contacts in the main unit of the watch;
    sensors mounted on the flexible printed circuit and configured to generate data;
    a clasp that couples the first portion of the elastomeric band to the second portion of the elastomeric band, wherein the clasp comprises interconnects that are coupled to the flexible printed circuit and carry the data; and
    light-emitting diodes on the flexible printed circuit that are configured to emit light through at least some of the elastomeric band material.

14. The watch band defined in claim 13 wherein the elastomeric band has opposing first and second surfaces, wherein the light-emitting diodes emit light through the first surface, and wherein the sensors gather sensor readings through the second surface.

15. An electronic device, comprising:
    a strap having first and second surfaces, wherein the first surface faces a first direction and the second surface faces a second direction that is opposite the first direction;
    an electrical unit coupled to the strap;
    light-emitting diodes that emit light through the first surface in a given direction, wherein the strap comprises elastomeric polymer, wherein the light-emitting diodes are each formed in respective cavities in the elastomeric polymer, and wherein the cavities have reflective sidewalls that extend between the first and second surfaces in the given direction;
    sensors that make sensor measurements through the second surface; and
    a flexible printed circuit substrate coupled to the light-emitting diodes.

16. The electronic device defined in claim 15 wherein the flexible printed circuit substrate includes at least one serpentine segment, the electronic device further comprising clear polymer with light-diffusing particles in the cavities.

* * * * *